Figure 1:
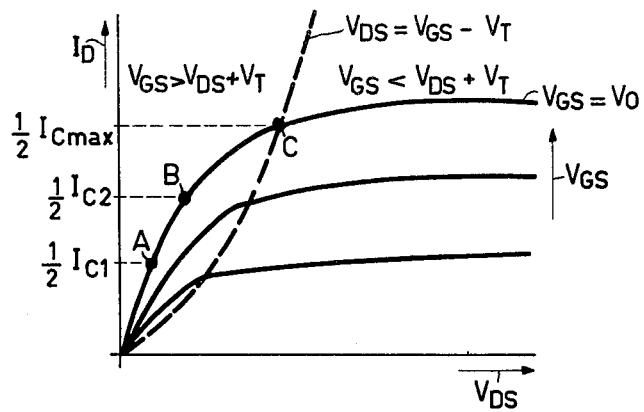

United States Patent [19]

Boeke

[11] 4,415,864
[45] Nov. 15, 1983

[54] VARIABLE-GAIN AMPLIFIER STAGE EQUIPPED WITH FIELD-EFFECT TRANSISTORS

[75] Inventor: Wouter M. Boeke, Nijmegen, Netherlands

[73] Assignee: U.S. Philips Corporation, New York, N.Y.

[21] Appl. No.: 228,528

[22] Filed: Jan. 26, 1981

[30] Foreign Application Priority Data

Feb. 25, 1980 [NL] Netherlands ............... 8001117

[51] Int. Cl.³ .............................................. H03F 3/45
[52] U.S. Cl. ................................... 330/253; 330/261
[58] Field of Search .............. 330/253, 254, 257, 261

[56] References Cited
U.S. PATENT DOCUMENTS 3,961,279 6/1976 Davis ............................... 330/253

OTHER PUBLICATIONS

Hosticka, B. J., Dynamic Amplifiers in C.M.O.S. Technology Electronics Letters, Dec. 6, 1979, vol. 13, No. 25.

Primary Examiner—James B. Mullins
Assistant Examiner—Gene Wan
Attorney, Agent, or Firm—Robert T. Mayer; Bernard Franzblau

[57] ABSTRACT

A variable gain amplifier stage comprises two field-effect transistor connected as a differential pair with a controlled tail-current source as gain control so that a slope control is obtained. The transistors, connected as a differential pair, each have a field-effect transistor operated in the triode region as a load so that the signal resistance of said transistors is a function of the tail current. The gain factor of the amplifier stage thus is determined by the slope of the amplifier transistor as a function of the tail current and by the signal-current resistance of the load transistors as a function of the control current, which, over a comparatively wide range of tail current, yields a substantially linear relationship between the gain factor expressed in decibels and the tail current.

8 Claims, 5 Drawing Figures

VARIABLE-GAIN AMPLIFIER STAGE EQUIPPED WITH FIELD-EFFECT TRANSISTORS

The invention relates to a variable-gain amplifier stage equipped with field-effect transistors and comprising a first and a second field-effect transistor of a first conductivity type whose gate electrodes constitute the input of the amplifier stage and whose source electrodes are jointly connected to a controllable current source for controlling the slope of the first and the second field-effect transistors, and a third and a fourth field-effect transistor connected as loads in the drain circuits of the first and the second transistors, an output signal being available between the drain electrodes of the first and the second field-effect transistors.

An amplifier stage whose gain-factor is variable by control of the tail current of the differential pair in order to control the slope of the first and the second transistors is known. If such an amplifier stage is equipped with field-effect transistors and the third and the fourth transistors are included in the drain circuits of the first and the second transistors as load-current sources, as is common practice in fixed-gain amplifiers using field-effect transistors, see inter alia U.S. Pat. No. 3,961,279 and U.S. Pat. No. 3,947,778, a variable-gain amplifier stage is obtained in which the variation of the gain factor is determined by varying the slope of the first and the second transistors. This yields a gain which varies as a function of the tail current, which variation is determined by the characteristics of the first and the second transistors and is not always suitable for practical purposes. Some applications require a gain factor with an exponential function of the tail current, i.e. a linear relationship between the logarithm of the gain factor and the tail current. It is an object of the invention to provide such a circuit and to this end it is characterized in that the third and the fourth transistors are operated in the triode region.

The invention is based on the recognition that by operating the third and the fourth transistors in the triode region, the differential resistance of said third and fourth transistors is a function of the tail current and varies with said tail current. Experiments reveal that the gain factor—which is determined by the variation of the slope of the first and the second transistors and the variation of the differential resistance of the third and fourth transistors—exhibits the desired variation as a function of the tail current over a comparatively wide range of tail currents.

In this respect it is to be noted that it is known per se to operate a field-effect transistor in its triode region in order to replace a resistor in fixed-gain amplifier stages. The operating point is then fixed. The invention is based on the recognition that, if such a field-effect transistor, operated as a resistor, is used in a tail-current controlled amplifier, the operating point varies with the tail current, which yields the desired result.

A first preferred embodiment of an amplifier stage in accordance with the invention may further be characterized in that the third and the fourth transistors are of a second conductivity type opposite to the first conductivity type and have their drain electrodes connected to the drain electrodes of the first and the second transistors respectively, and that the gate electrodes are jointly connected to a point of reference voltage for biassing said third and fourth transistors in the triode region.

In this embodiment transistors of different conductivity types are employed. A preferred embodiment of an amplifier stage in accordance with the invention using transistors of the same conductivity type may be characterized in that the third and the fourth transistors are of the first conductivity type, the source electrodes being connected to the drain electrodes of the first and the second transistors respectively, and that the amplifier stage further comprises a first and a second current source and fifth and sixth field-effect transistor, having their source electrodes connected to the source electrodes of the third and the fourth transistors respectively and whose gate electrodes are connected both to the associated drain electrodes and to the gate electrodes of the third and the fourth transistors respectively, the first and the second current sources being included in the drain circuits of the fifth and the sixth transistors respectively and being operated with a current such that the third and the fourth transistors operate in the triode region.

Figure 2:
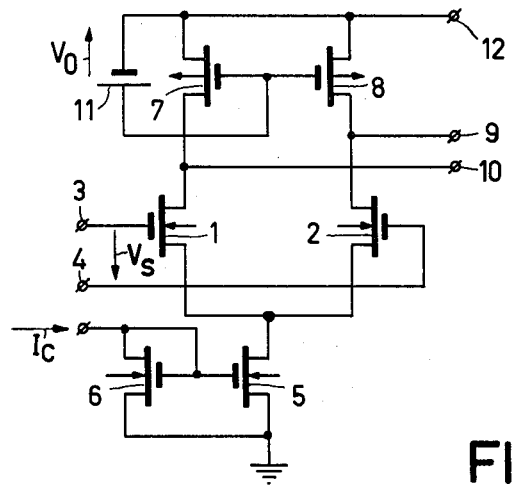
Figure 3:
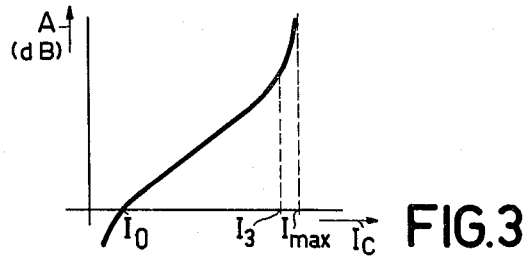
Figure 4:
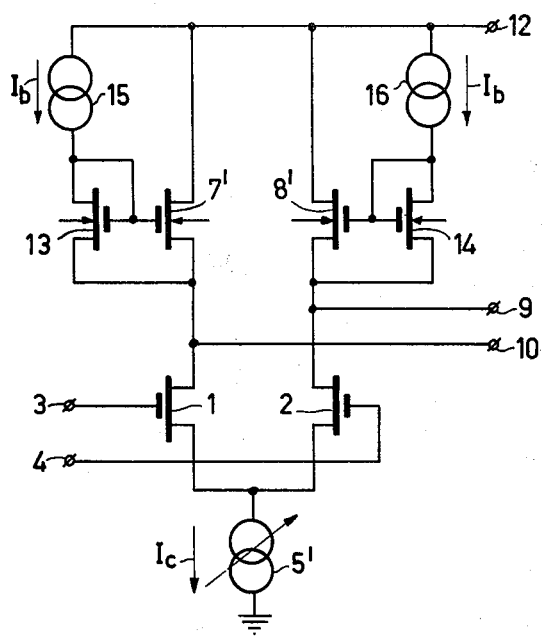
Figure 5:
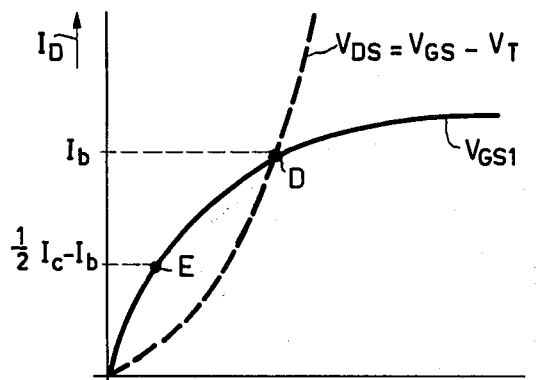

The invention will be described in more detail with reference to the drawing, in which:

FIG. 1 represents the characteristics of a field-effect transistor so as to illustrate the operation of the circuit arrangement in accordance with FIG. 2, FIG. 2 shows a first embodiment of an amplifier stage in accordance with the invention, FIG. 3 is a diagram representing the gain factor of an amplifier in accordance with the invention as a function of the control current, FIG. 4 shows a second embodiment of an amplifier stage in accordance with the invention, and FIG. 5 represents a characteristic in accordance with FIG. 1 to illustrate the operation of the circuit arrangement of FIG. 4.

FIG. 1 shows the characteristics of an n-channel field-effect transistor, $I_D$ being the drain current, $V_{DS}$ being the drain-source voltage, $V_{GS}$ being the gate-source voltage and $V_T$ being the threshold voltage of the transistors. The dashed curve connects all points for which $V_{GS}-V_T=V_{DS}$. This is the characteristic of a field-effect transistor with interconnected gate and drain electrodes. The region where $V_{gs}<V_{DS}+V_T$, i.e. to the right of the dashed curve in FIG. 2, is called the saturation region, where the drain current $I_D$ is substantially independent of the drain-source voltage and the field-effect transistor functions as a current source. The region to the left of the dashed curve ($V_{gs}>V_{DS}+V_T$) is the triode region where the drain-source voltage $V_{DS}$ greatly depends on the drain current $I_D$. For p-channel transistors similar characteristics with opposite polarities are valid.

FIG. 2 shows a variable gain amplifier in accordance with the invention. It comprises first and second n-channel field-effect transistors 1 and 2 having gate electrodes connected to a differential input 3-4. The source electrodes are jointly connected to the drain electrode of an n-channel transistor 5, which in combination with an n-channel transistor 6 is connected in a current-mirror arrangement. The drain electrode of transistor 6 is connected to a control current input to which a control current $I_c$ may be applied.

If the d.c. level at input 3-4 is sufficiently high so that the transistor 5 operates in the saturated region, the tail current of the pair of transistors 1 and 2 is equal to $I_C$, or is proportional thereto if the gain factor of the current mirror (5, 6) is unequal to unity. A signal voltage $V_S$ at the input distributes the current $I_C$ between the drain circuits of the two transistors 1 and 2 with a transconductance which is determined by the slope and thus by the current $I_s$.

The drain circuits of transistor 1 and transistor 2 respectively include p-channel transistors 7 and 8 as a load. The drain electrodes of said transistors 7, 8 are connected to the drain electrodes of the respective transistors 1 and 2 and to a differential output 9—10. The source electrodes are connected to a positive supply terminal 12 and the gate electrodes to a bias-voltage source 11, which produces a voltage $V_o$ between the gate electrode and the source electrode of the transistors 7 and 8. This voltage $V_{gs}=V_o$ is indicated in the characteristics of FIG. 1.

In the absence of an input signal ($V_s=0$) a current equal to $\frac{1}{2}I_C$ will flow through transistors 7 and 8. At a specific value $I_C=I_{C1}$ of this control current the transistors 7 and 8 thus operate at point A in the characteristic of FIG. 1 which, at a sufficiently high value of the voltage $V_O$ is situated in the triode region. Transistors 7 and 8 then present a certain resistance to signal currents which is equal to the slope of the curve $V_{GS}=V_O$ at the location of point A. For a larger control current $I_C=I_{C2}$ transistors 7 and 8 operate at point B and present a higher resistance to signal currents. In this way transistors 7 and 8 influence the gain factor of the amplifier stage of FIG. 2 as a function of the control current. In the characteristic shown in FIG. 1 this control may be used up to a value of the control current $I_C=I_{Cmax}$ (operating point C) for which transistors 7 and 8 operate at the boundary between the triode region and the saturated region. It is then required that the voltage between supply terminal 12 and input 3-4 be sufficiently high so that transistors 1 and 2 operate in the saturated region.

If said requirement is met (transistors 1, 2 and 5 saturated and transistors 7 and 8 not saturated) the gain factor A in decibels as a function of the control current $I_c$ will vary as illustrated in FIG. 3. In the region $I_0 < I_C < I_3$ this characteristic is substantially linear, which is the desired effect.

The circuit of FIG. 2 comprises p-channel and n-channel field-effect transistors. It is alternatively possible to employ field-effect transistors of the same conductivity type as the transistors 1 and 2 for the load transistors 7 and 8. FIG. 4 shows an example of such a variant employing n-channel transistors 1 and 2. Of said transistors 7' and 8' the source electrodes are connected to the drain electrodes of the transistors 1 and 2 and the drain electrodes to the positive supply terminal 12. The source and the gate electrode of transistor 7' are respectively connected to the source and the gate electrode of an n-channel transistor 13 and the source and the gate electrode of transistor 8' are respectively connected to the source and the gate electrode of an n-channel transistor 14. The drain circuits of transistors 13 and 14 respectively include a current source 15 and 16.

Transistor 13 and transistor 14 each have a connection between the gate and drain electrodes and therefore satisfy the characteristic $V_{DS}=V_{GS}-V_T$ shown in FIG. 5. FIG. 5 corresponds to FIG. 1.

If the current sources 15 and 16 have a current $I_b$ transistors 13 and 14 will consequently operate at point D shown in FIG. 5. Transistors 7' and 8' thus operate in accordance with a $I_D-V_{DS}$ characteristic which passes through point D and which is indicated by $V_{GS1}$, $V_{GS1}$ being the voltage produced across transistors 13 and 14 by the current sources 15 and 16. In the absence of an input signal a current equal to $\frac{1}{2}I_C$ will flow in the drain circuits of transistors 1 and 2 so that a current equal to $\frac{1}{2}I_C-I_b$ will flow through transistors 7' and 8'. As the result of this, transistors 7' and 8' now operate at point E, which is situated within the triode region for $0 < \frac{1}{2}I_C - I_b < I_b$, i.e. for $2I_b < I_C < 4I_b$. Within these limits the operation of the circuit of FIG. 4 corresponds to the operation of the circuit of FIG. 2, but now using transistors of one conductivity type. Owing to said steps transistors 7' and 8' operate in the triode region. As a result of this, it may happen that the current sources 15 and 16 have to operate with a too negative voltage. If this presents a practical problem, it is for example possible to select a higher supply voltage for the current sources 15 and 16 or to include an additional voltage-shifting element in series with transistors 7' and 8' between their drain electrodes and the positive supply terminal 12.

In the foregoing it has been assumed that the geometries of the transistor pairs (1-2, 5-6, 7-8, 7'-8', 7'-13 and 8'-14) are equal, so that they each have the same characteristics. Unequal geometries may also be useful and lead to similar results. As an example, it is possible to select unequal length-width ratios for the channels of the transistors 13 and 7' and 14 and 8'.

What is claimed is:

1. A variable gain amplifier stage comprising first and second field-effect transistors of a first conductivity type whose gate electrodes constitute the input of the amplifier stage and whose source electrodes are jointly connected to a controllable current source for controlling the slope of the first and the second field-effect transistors, third and fourth field-effect transistors, means connecting said third and fourth transistors as loads in the drain circuits of the first and second transistors, an output signal being available between the drain electrodes of the first and second field effect transistors, and means for operating the third and fourth transistors in the triode region.

2. An amplifier stage as claimed in claim 1 wherein the third and fourth transistors are of a second conductivity type opposite to the first conductivity type, the drain electrodes of the third and fourth transistors being connected to the drain electrodes of the first and second transistors respectively, and the gate electrodes of the third and fourth transistors are jointly connected to a point of reference voltage for biasing said third and fourth transistors in said triode region.

3. An amplifier stage as claimed in claim 1 wherein the third and fourth transistors are of the first conductivity type with the source electrodes being connected to the drain electrodes of the first and second transistors respectively, and said operating means comprises first and second current sources and fifth and sixth field-effect transistors, the source electrodes of the fifth and sixth transistors being connected to the source electrodes of the third and fourth transistors respectively and whose gate electrodes are connected to the gate electrodes of the third and fourth transistors respectively, means connecting the gate electrodes of the fifth and sixth transistors to their respective drain electrodes, the first and second current sources being connected in the drain circuits of the fifth and sixth transistors respectively and being operated with a current so that the third and fourth transistors operate in the triode region.

4. A variable gain amplifier comprising first and second field-effect transistors having gate electrodes coupled to first and second input terminals, respectively, and drain electrodes coupled to first and second output terminals, respectfully, means jointly connecting source electrodes of said first and second transistors to a controllable current source that controls the slope of the first and second transistors, third and fourth load field-effect transistors coupled to the drain electrodes of the first and second transistors, respectively, and in series with the first and second transistors, respectively, and means for biasing the third and fourth transistors into the triode region of their characteristics so that the differential resistance of the third and fourth transistors varies as a function of the tail current of said amplifier.

5. A variable gain amplifier as claimed in claim 4 wherein said controllable current source comprises a current mirror having a first terminal coupled to the jointly connected source electrodes of the first and second transistors, a second terminal coupled to a point of reference potential, and a third terminal coupled to a source of control current.

6. A variable gain amplifier as claimed in claim 5 wherein said first and second transistors are of one conductivity type and the third and fourth transistors are of the opposite conductivity type, and wherein said biasing means includes means for jointly connecting the gate electrodes of said third and fourth transistors to a point of reference voltage of a value to place the operating point of the third and fourth transistors in the triode region of their operating characteristic, said operating point being variable as a function of said control current but within said triode region.

7. A variable gain amplifier as claimed in claim 4 wherein said controllable current source includes a fifth field-effect transistor having a control terminal for connection to a source of control current and an output terminal coupled to the jointly connected source electrodes of the first and second transistors, and means for biasing said first, second and fifth transistors into their saturation region.

8. A variable gain amplifier as claimed in claim 4 wherein said biasing means includes means jointly connecting gate electrodes of the third and fourth transistors to a source of DC voltage of a value to bias the third and fourth transistors into the triode region of their operating characteristics.

* * * * *

UNITED STATES PATENT AND TRADEMARK OFFICE
CERTIFICATE OF CORRECTION

PATENT NO. : 4,415,864

DATED : November 15, 1983

INVENTOR(S) : WOUTER M. BOEKE

It is certified that error appears in the above-identified patent and that said Letters Patent is hereby corrected as shown below:

In the Abstract:

Line 2, "transistor" should be --transistors--
Line 12, after "current" delete "," (comma)

Column 2, line 44, change "2" to --1--

Claim 3, line 10, change "whose" to --the--; after "electrodes" delete "are" and insert --of the fifth and sixth transistors being--
Claim 3, line 16, change "so" to --such--
Claim 4, line 5, change "respectfully" to --respectively--

Insert New Claim 9 as follows:

--A variable gain amplifier as claimed in Claim 4 wherein said first and second field-effect transistors are connected as a differential pair.--

On the title page "8 Claims" should read -- 9 Claims --.

Signed and Sealed this

Sixteenth Day of October 1984

[SEAL]

Attest:

GERALD J. MOSSINGHOFF

*Attesting Officer*  *Commissioner of Patents and Trademarks*